United States Patent [19]

Dietz

[11] Patent Number: 5,076,876

[45] Date of Patent: Dec. 31, 1991

[54] METHOD OF ATTACHING AN ELECTRONIC DEVICE TO A SUBSTRATE

[75] Inventor: Raymond L. Dietz, Georgetown, Mass.

[73] Assignee: Diemat, Inc., Topsfield, Mass.

[21] Appl. No.: 485,249

[22] Filed: Feb. 21, 1990

Related U.S. Application Data

[62] Division of Ser. No. 369,105, Jun. 21, 1989, Pat. No. 4,933,030.

[51] Int. Cl.$^5$ ............................................. B32B 31/06
[52] U.S. Cl. ..................................... 156/325; 156/89; 160/1.13; 160/1.14; 252/514; 501/19; 501/32; 501/46
[58] Field of Search ................. 156/89, 325; 106/1.13, 106/1.14; 252/514; 501/19, 46, 32

[56] References Cited

U.S. PATENT DOCUMENTS

| | | |
|---|---|---|
| 2,385,580 | 9/1945 | Knox . |
| 3,088,833 | 5/1963 | Pirooz . |
| 3,454,408 | 7/1969 | Busdiecker . |
| 3,480,566 | 11/1969 | Hoffman . |
| 3,497,774 | 6/1967 | Hornberger et al. . |
| 3,650,778 | 3/1972 | Dumesnil et al. . |
| 3,703,386 | 11/1972 | Dietz . |
| 3,787,218 | 1/1974 | Dietz et al. . |
| 3,837,866 | 9/1974 | Malmendier et al. . |
| 4,002,799 | 1/1977 | Dumesnil et al. . |
| 4,401,767 | 8/1983 | Dietz et al. ........................... 501/19 |
| 4,459,166 | 7/1984 | Dietz et al. . |
| 4,743,302 | 5/1988 | Dumesnil et al. . |
| 4,761,224 | 8/1988 | Husson, Jr. et al. . |

FOREIGN PATENT DOCUMENTS

| | | | |
|---|---|---|---|
| 37-12810 | 9/1962 | Japan | ..................................... 501/46 |
| 61-36135 | 2/1986 | Japan | ..................................... 501/46 |
| 1552648 | 9/1979 | United Kingdom . | |

OTHER PUBLICATIONS

JMI AuSub Die Attach Paste (Johnson Matthey Electronic Materials Div.).

Development of Adhesive Die Attach Technology in Cerdip Packages; Material Issues*, F. K. Moghadam, Jan. '84.

New Die Attach Material for Hermetic Packaging, R. L. Dietz and L. Winder, 1983.

*Primary Examiner*—Caleb Weston
*Attorney, Agent, or Firm*—Thomas P. Liniak

[57] ABSTRACT

A stable $Tl_2O_3$, $V_2O_5$, $P_2O_5$ glass composition for a die attach paste requiring no resin and having a glassy edge temperature of below about 350° C.

15 Claims, 3 Drawing Sheets

FIG. 3
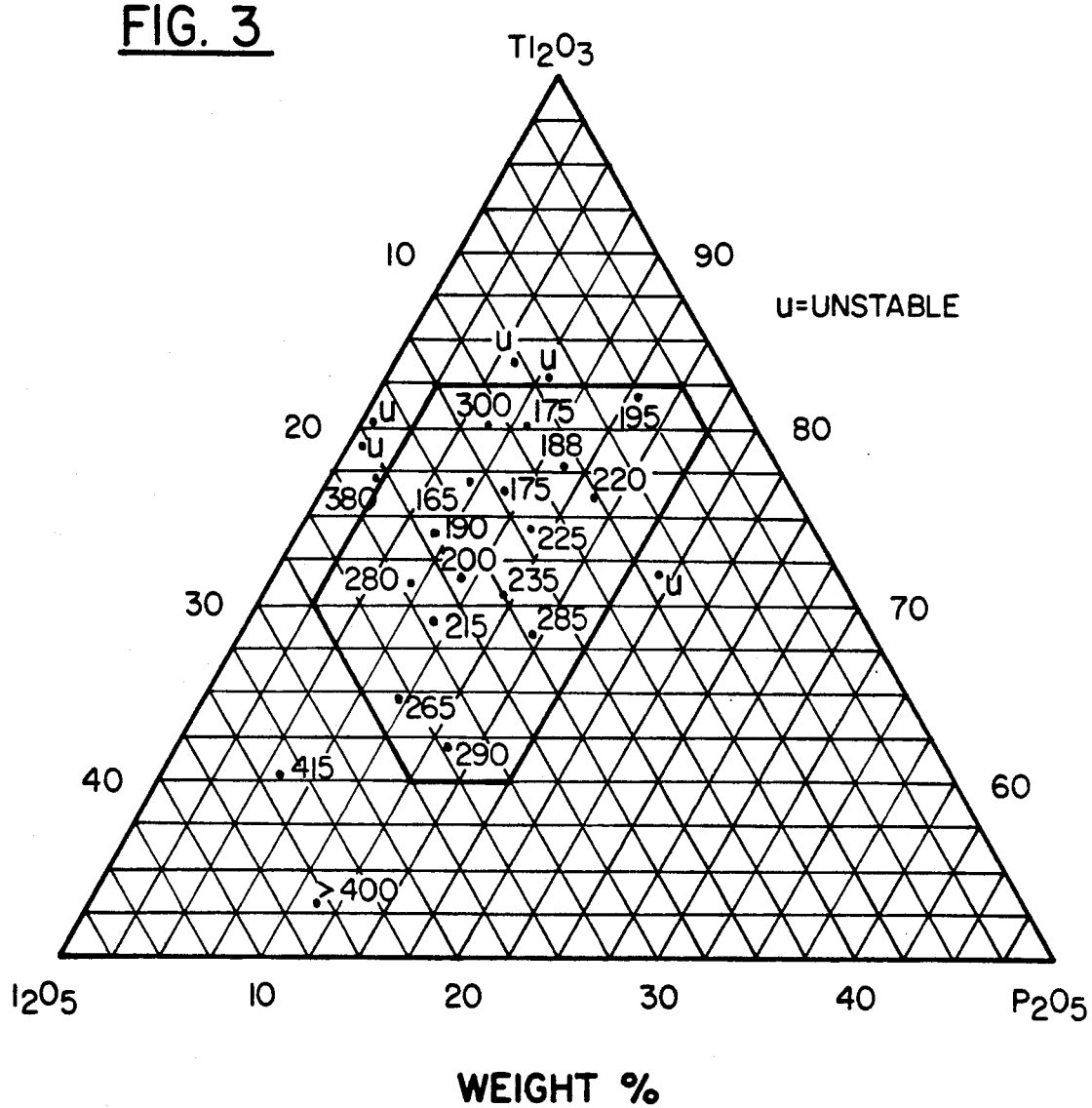
WEIGHT %
FIG. 4

METHOD OF ATTACHING AN ELECTRONIC DEVICE TO A SUBSTRATE

This is a continuation of application Ser. No. 07/369,105 filed June 21, 1989, Pat. No. 4,933,030.

TECHNICAL FIELD

This invention relates to vitreous glasses having a low glassy edge temperature which are particularly useful in bonding electronic devices such as integrated circuit silicon devices to ceramic substrates, and to methods of bonding using these glasses, primarily in paste form.

BACKGROUND OF THE INVENTION

Glasses capable of fusing at the lowest possible temperature to form a bond between the two basic parts of an electronic package (e.g. a die and its ceramic substrate) have long been sought and some success has been achieved. Exemplary of the current state of the art, in this respect, are the following:

| |
|---|
| U.S. Pat. No. 3,454,408 |
| 3,497,774 |
| 3,650,778 |
| 3,837,866 |
| 4,002,799 |
| 4,459,166 |
| 4,743,302 |
| 4,761,224 |
| British Patent No. 1,552,648 |

Representative of commercial materials embodying the disclosure of U.S. Pat. No. 4,459,166 are the die attach pastes known as JMI AuSub pastes sold by Johnson Matthy Corporation.

While some prior art references discuss the glasses employed in terms of their low melting temperatures, as recognized for example in U.S. Pat. No. 3,454,408, Col. 4, lines 24 et seq., it is perhaps more a-propriate to define such glasses in terms of their "glassy edge temperature" and for crystallinity characteristics in terms of their "devitrification edge". The disclosure herein adopts this terminology for purposes of defining and describing the subject invention. Thus the term "glassy edge temperature" is used herein to define that temperature at which the viscosity of the glass reaches about $10^{11.5}$ poises, thus permitting fusion of the glass particles (e.g. when in a paste) to take place. Likewise, the term "devitrification edge" is used herein to define a further point in the heating of the glass to fuse it (and thus usually a time-temperature relationship) before which (and thus usually a point of temperature below which) the glass after fusing at its glassy edge temperature begins to crystallize. The temperature difference between the "glassy edge temperature" and the "divitrification edge temperature" is referred to as the "glassy range".

Generally speaking, the above-recited prior art has had one or more limiting features imposed upon it. Firstly, to be truly suitable in the die attach area, most of the glasses are required to be heated to 400° C. and often 450° C. in order to obtain an acceptable bond of the die to the substrate. Such temperatures, while currently deemed "low", are still significantly high when it comes to handling integrated circuitry. Secondly, several of the known glasses are used in paste form with crystalline or silver flake additives, but which also use or require in addition to a solvent, a resin material for giving the paste the proper rheology for application. Such resins notoriously retain moisture, which has a significantly detrimental affect upon the life of the components in the package. Indeed, the military currently specifies in certain circumstances a limit of 5000 ppm on such moisture within the final hermetically sealed package.

Exemplary of one of the most efficacious of the prior art systems is the invention disclosed in U.S. Pat. No. 4,459,166 (and its parent, U.S. Pat. No. 4,401,768). While properly referring to itself as a low temperature system, the term is obviously relative. As reported in Col. 3, lines 4–6, the die attach temperatures contemplated are between 425°–450° C. A significant lowering of these temperatures would be a major advance in the art.

Yet another drawback to the development of acceptable low temperature glasses is the tendency of some glass, though having a very low glassy edge temperature, to crystallize excessively during the heating and cooing that is required to take place during formation of the bond during packaging. Stated another way, the glasses employed have too narrow a "glassy range", so that crystallization is virtually inevitable, absent very careful control. Such glasses are referred to as being "unstable", while those not having this problem are referred to as "stable" glasses.

Devitrification of the vitreous glass in a paste during bonding which has as its major goal the wetting of diverse electronic components, thereby to strongly adhere these components together, can be severely detrimental to the adhesive qualities of the ultimate bond structure, and can have other deleterious affects as well. This need to achieve a bond whose glass structure is substantially non-crystalline often eliminates numerous possible glass compositions that might otherwise have rather acceptable, low glassy edge temperatures.

To place the above in perspective, as far as die attaching is concerned, the loading of glasses with silver flake, called the Ag/glass method of die attach (reflected in some of the above references, e.g. see U.S. Pat. '774, '166, and '224 listed above) overcame several problems associated with the previously used Si/Au eutectic die attach methodology. Unfortunately, to date, this Ag/glass methodology, which would otherwise be extremely desirable to use, requires too high processing temperatures for the newer, higher density (submicron) semiconductor devices, silicon as well as gallium arsenide. Also, this higher processing temperature (400° C.) creates an associated higher, undesirable stress on the device when cooled. Other disadvantages include:

1. The relatively high processing temperatures and times at temperature required to generate adhesion of the die to the package can also cause swimming of the lead frames in CerDip and oxidation of the gold-plated seal rings in multilayer ceramics The latter problem is the more serious when using gold-backed die, which generally requires higher processing temperatures. Nickel oxidation retards the wetting of the goldtin preforms used in the final seal operation and contributes to poor hermeticity yields. Nickel oxidation can be minimized by reducing the peak processing temperature, but normally at the sacrifice of adhesion, or at the very least, consistency of adhesion (reliability). To alleviate this compromise, the industry has largely been forced to use a forming gas clean-up cycle before final seal. This reduces the nickel oxide back to nickel and for the most part improves the gold-tin wetting to an acceptable level. However, complete wetting (and hermeticity) is not sufficient if excessive nickel has diffused through the gold. Increasing the gold-plating thickness and/or density retards the oxidation, but adds significant costs without completely solving the problem.

Thus, to process multilayer packages (PGA, CCC, Sidebraze, etc.), particularly with large area gold-backed die, requires not only undesirably high processing temperatures, but also necessitates three separate environments for processing—the initial firing in air, the oxide clean-up in forming gas, and the final seal in nitrogen, all normally in expensive conveyor furnaces.

2. The larger area die, normally associated with this package, requires excessively long times to drive the organics out without causing excessive voids. Die in excess of 400 mils on a side, largely common in gate array devices, can require a minimum of three hours drying. This results in an extremely low throughput and heavy capital investment. The "single pass" versions which reduce the drying time are largely unproven and create another set of problems.

It is apparent from the above that there exists a need in the art for a new glass composition, paste and method of use which overcomes the above-described problems. It is an object of this invention to fulfill this and other needs in the art which will become apparent to the skilled artisan once given the following disclosure.

SUMMARY OF THE INVENTION

Generally speaking, this invention fulfills the above-described needs by providing a glass composition having a glassy edge temperature of about 350° C. or less, preferably 300° C. or less, or 250° C. or less, or most preferably about 200° C. and which consists essentially of by weight percent on an oxide basis: about 60–82.5% $Tl_2O_3$; about 2.5–27.5% $V_2O_5$; and about 2.5–17.5% $P_2O_5$. In the preferred embodiments, the glass compositions of this invention are stable in that they have subs no devitrification edge below about 460° C. during use as a sealant bond material for electronic packaging.

This invention also includes a unique, essentially resin-free paste comprising an organic solvent, preferably a terpineol, with the unique glass composition of this invention as described above.

Such pastes, furthermore, find unique applicability when attaching electronic components to a ceramic. For this reason this invention contemplates within its scope an improved method of attaching an electronic component, such as an integrated circuit silicon die to a ceramic (substrate), the method including applying an Ag/glass paste of this invention as bonding agent between the parts to be bonded into a package and heating the package to a temperature for a time sufficient to fuse the glass, thereby to bond the device to the ceramic and thereafter cooling the package to room temperature. In the preferred embodiments the paste includes silver flake, the resulting bond is substantially non-crystalline and has a moisture content significantly below 5000 ppm.

Several objects of this invention are evident from the above. For example:

One object of this invention is to provide low temperature glasses of good fluidity at low temperatures that do not have a tendency to devitrify to a large degree. Such glasses may be referred to as stable glass compositions having a low glassy edge temperature.

A further object of this invention is to provide a silver/glass die attach material that incorporates the above glasses making possible the inorganic attachment of semiconductor devices at low temperatures (e.g. less than 350° C).

A further object of the invention is to provide a silver/glass paste without the use of resins that gives superior dispensing properties and faster processing in the application of this invention without creating voids, or retaining significant amounts of moisture.

A further object of this invention is to provide a method, by using above glasses and loading with a metal, for attaching semiconductor devices at a temperature below 350° C.

A still further object of this invention is to provide an Ag-filled glass that will significantly minimize residual stress (thermally induced) in the die, particularly when larger die are packaged.

This invention will now be described with respect to certain embodiments thereof in association with the accompanying drawings, wherein:

BRIEF DESCRIPTION OF THE DRAWINGS

FIG. 3 is a ternary diagram referencing glassy edge temperatures of glasses within and without the scope of this invention.

FIG. 4 is a side sectional view of a preferred environment of use of this invention.

DETAILED DESCRIPTION OF CERTAIN EMBODIMENTS OF THE INVENTION

Figure 1:
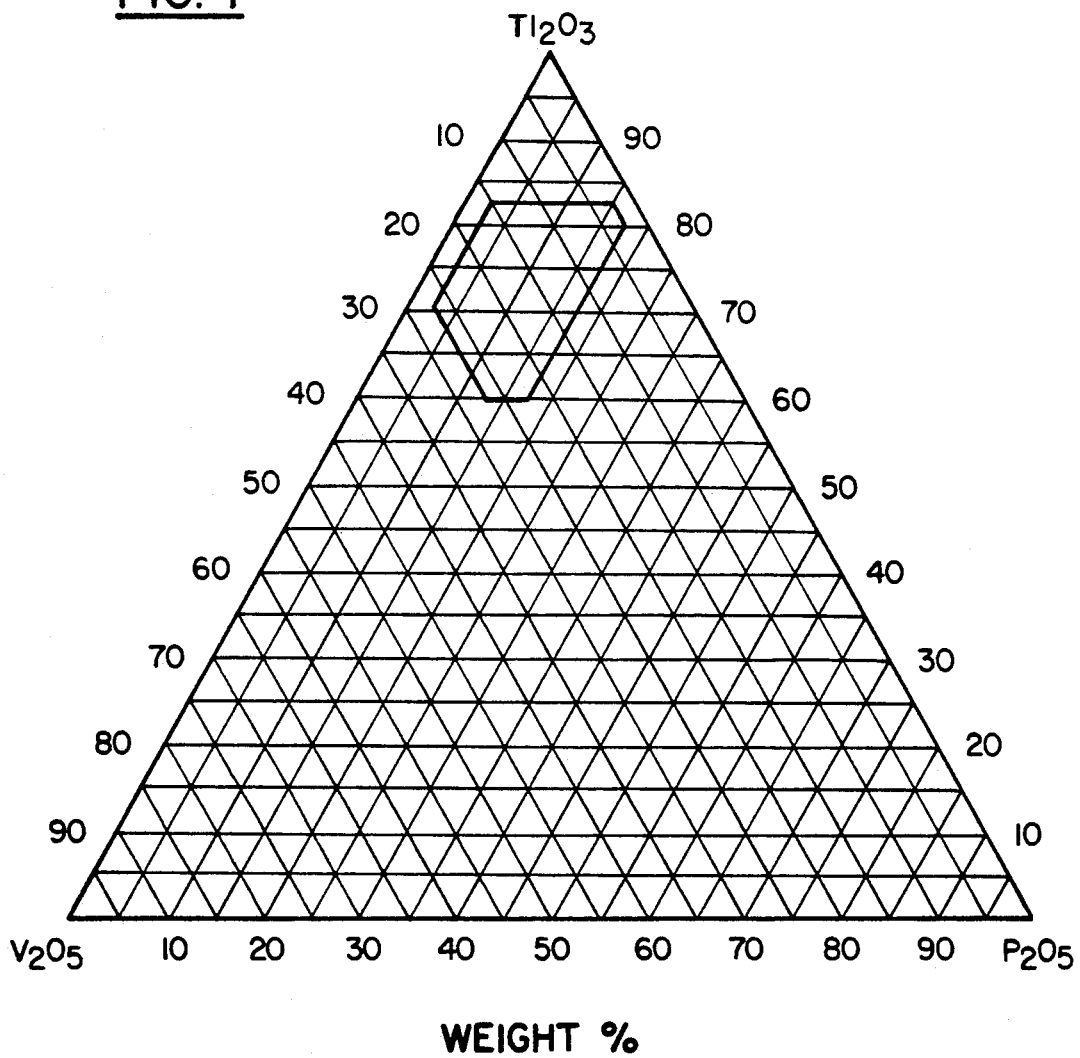
FIG. 1 is a ternary diagram of glass compositions within and without the scope of this invention.

The glass compositions of this invention have a wide field of use. Of particular importance, and thus as the preferred environment for use of the glass compositions, is in the art of bonding an electronic device to a ceramic. Particularly preferred usage, in this respect, is where an integrated circuit silicon die is to be bonded to a ceramic substrate, and the glass compositions of this invention form the glass material in a paste which further includes a solvent alone or preferably with an additive powder, particularly particles of silver (Ag). Such a paste is generally referred to as an Ag/glass die attach paste.

The glass compositions contemplated are comprised of thallium, vanadium and phosphorus, which on an oxide basis are accurately referred to as a $Tl_2O_3/V_2O_5/P_2O_5$ glasses. The characteristics of these glasses as contemplated herein are that they have a glassy edge temperature of about 350° C. or less, preferably of about 300° C. or less, more preferably of about 250° C. or less, and in certain particularly preferred enbodiments of about 200° C. In the preferred embodiments, furthermore, the glasses are stable, having a; devitrification edge above about 460° C. for times needed to form a good bond. Stated another way, the resulting bonds formed by using the glass compositions of this invention are, except for any crystalline additive employed, substantially non-crystalline. Stated still another way, the preferred glasses of this invention remain substantially non-crystalline throughout the bonding process, including cool down to room temperature.

Generally speaking, and in order to fulfill the objectives of this invention, the glass compositions contemplated consist essentially of by weight on an oxide basis:

| about 60-82.5% | $Tl_2O_3$ |
| about 2.5-27.5% | $V_2O_5$ |
| about 2.5-17.5% | $P_2O_5$ |

Preferably, they consist essentially of by weight on an oxide basis

| about 69-74% | $Tl_2O_3$ |
| about 16-22% | $V_2O_5$ and |
| about 7-10% | $P_2O_5$ |

Such glasses often have glassy edge temperatures of about 300° C or less, and in certain cases about 250° C. or less.

A particularly preferred glass composition consists essentially of by weight on an oxide basis:

| about 72% | $Tl_2O_3$ |
| about 19% | $V_2O_5$ and |
| about 9.0% | $P_2O_5$ |

In this latter case, an especially advantageous composition consists of these three ingredients and no others. In this respect, the term "consist(ing) essentially of" as used herein is meant to indicate that other ingredients may be added to formulate the glass composition, provided that they do not change the characteristics or objectives of this invention, in whole or in part. For example, as will be seen in some of the examples that follow, certain constituents such as lead (as PbO or $PbF_2$), borate (as $H_3BO_3$), $Al_2O_3$, $Ag_2O$, $Z_nO$, $Cu_2O$, $TeO_2$, $Nb_2O_5$ or $S_iO_2$ may, in small amounts, constitute a part of the glass compositions of this invention. Generally speaking, however, if added in amounts greater than about 5%, and usually greater than about 1%, they will have a deteriorating effect upon the objectives sought to be achieved herein.

Figure 2:
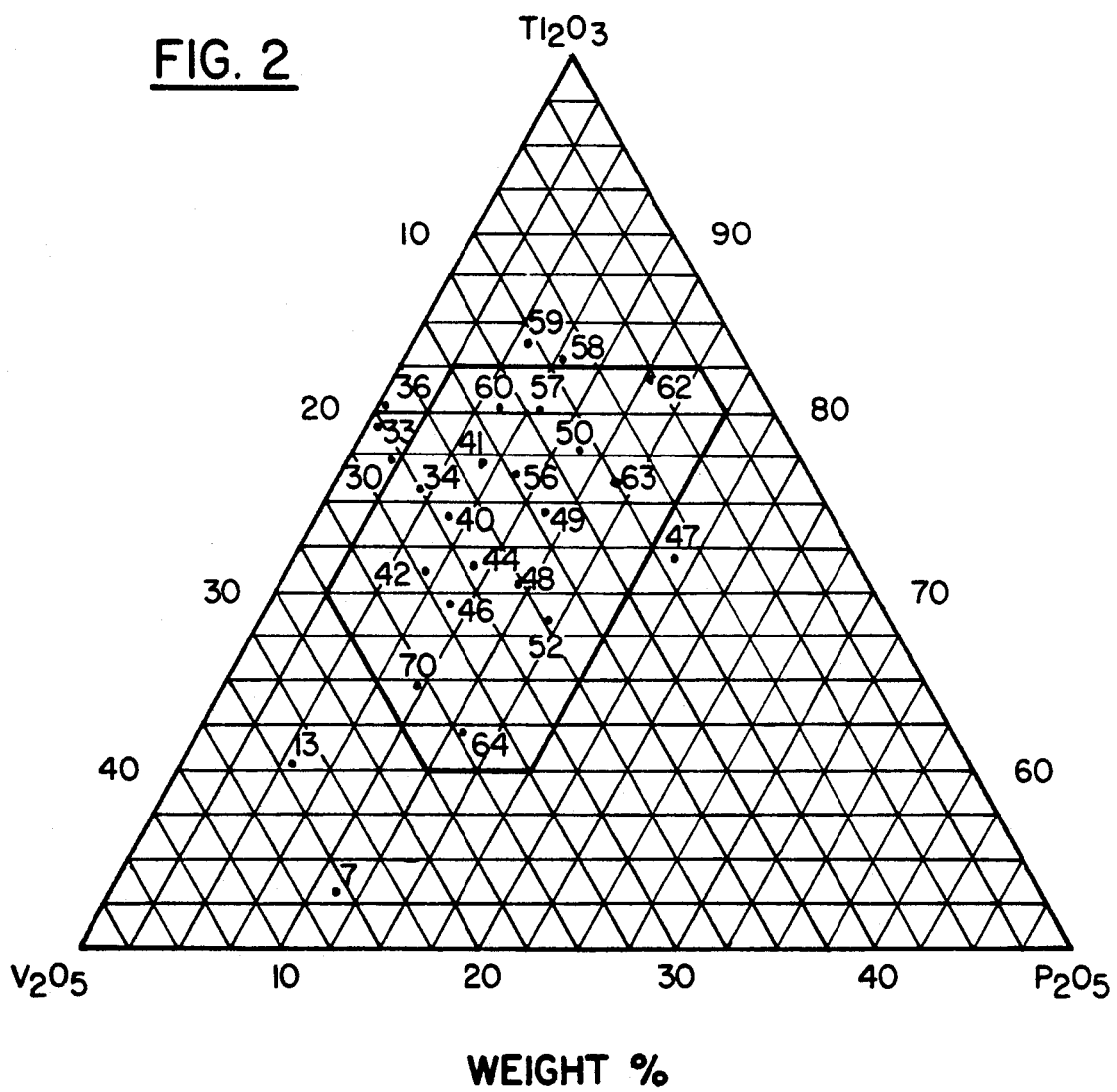
FIG. 2 is an enlarged diagram of FIG. 1 referencing the glass melt numbers indicated in Table 1.

While the mechanism by which the basic ternary system of this invention achieves its low temperature, vitreous characteristics, experimentation as shown in FIGS. 1-3 and reflected in the examples hereinafter presented evidence the need to stay within the approximate percentage ranges given above. For example, it appears that $P_2O_5$ serves as the primary stabilizing agent such that if too low an amount is used, deleterious amounts of crystallization occur. The other two ingredients, particularly thallium, appear to produce the characteristics of a strong glass bond structure, while at the same time providing a glass having a very low glassy edge temperature.

The formulation of these glasses may be done by any conventional technique. Melting in alumina, glazed silica, porcelain, aluminum, or platinum crucibles at 550-600° C. for about 10 minutes produces excellent homogeneous glasses which may thereafter be ground by standard particle reduction methods into fine powders for use as the glasses in Ag/glassy pastes.

The silver used in the Ag/glass pastes of this invention should be a silver powder either of the spherical or flake powder type. The flake type produces a shinier, more metallic-like finish with a higher fired density. Satisfactory silvers include those having a surface area in the range of 0.2 to 1.5 m²/gm, and a tap density of 2-5 g/cc. Preferably the flake is provided with a surfactant, such as a stearic acid lubricant, the importance of which is discussed hereinafter.

This invention contemplates pastes which do not necessarily employ Ag powders in their formulation. Instead, such pastes may be used in a wide variety of environments not necessarily employing silver. In most instances, however, an additive powder of some material may become necessary to accommodate the expansion characteristics of the silicon die with that of the substrate to which it is bonded. However, because of the unique qualities of the glass compositions of this invention, the Ag/glass pastes used for silicon die attach are particularly preferred pastes for these unique glasses. In this regard, one of the unique advantages of this invention is that a strong and adherent bond structure can be formed from an Ag loaded glass paste without the need for any resin material. Thus the only material necessary to employ other than the silver powder and glass powder is a solvent that can be quickly burned off and very low temperatures. While resins may be used if desired in accordance with known practices, if moisture content is a consideration they should be eliminated entirely. When this is done, the resultant bonds usually have a moisture content of less than about 5000 ppm, usually less than about 1000 ppm, and in the most preferred embodiments less than about 500 ppm. Also, the absence of resins allows much faster processing of the die attach material in a production environment, e.g. resin bearing pastes generally require a long drying step (especially large area die) prior to the firing cycle which must have a controlled heat-up rate. In the preferred embodiments, this invention requires no drying step with die sizes up to at least .400 mil square.

For some general uses, the solvent employed may be any well known solvent in the art. However, when using the paste as an Ag loaded die attach paste the terpineol solvents, particularly terpineol 318, appear to the important to use for best results. For example, ethylene glycol, propylene glycol, dipropylene glycol, monomethylene ether, various aliphatic alcohols (e.g. tri-deconal dodeconal), or petroleum solvents such as isopar L, M and H from Exxon do not work well, except the two named aliphatic alcohols do work to a certain extent. Terpineol 318 is a well known terpene alcohol made by Hercules, and consisting of a mixture of alpha, beta, and gamma terpineol (i.e. $C_{10}H_{18}O$, $C_{10}H_{17}O$, and $C_{10}H_{18}O$, respectively). The matching of the terpineol solvent and surfactant when resins are not employed, for proper results, is discussed later. The resulting paste provides an ideal rheology for the dispensing operation used in the application of the pate.

A particularly preferred paste as contemplated by this invention includes by weight percent:
about 70-72% silver flake with surfactant coating
about 18-22% glass
about 10-12% solvent

| about 70-72% | silver flake with surfactant coating |
| about 18-22% | glass |
| about 10-12% | solvent |

FIG. 4 illustrates a typical integrated circuit silicon chip 1 mounted on a ceramic substrate 4, the package being bonded together by a die attach vitreous glass 2 having skilled artisan that FIG. 4 is schematic only. In actual practice and in the preferred embodiments, the silver powder, being in relatively large amounts volumewise, fuses during the heating process and rarely remains as discrete particles as shown, thus rendering the ultimate bond structure opaque. The purpose of the schematic in FIG. 4 is to illustrate within the bounds of simple draftsmanship that the bond structure achieved is a solid structure of fused silver particles having between their interstices (i.e. substantially filling the interstices) a vitreous glassy adhesive structure of the glass composition of this invention, free of resin and organic solvent, and having a very low moisture content.

The methods used to employ the compositions and/or pastes of this invention may be manifold. It is conceivable, for example, that in certain circumstances the glass composition may be used by itself in non-paste form. On the other hand, as stated above, for most purposes, the glasses are formed into pastes using the aforesaid ingredients and applied by known techniques. Thereafter, heating at the lower temperatures (e.g. 200°-350° C. depending upon the glass composition) available because of this invention, for conventional times (e.g. 4-15 minutes), there is achieved a strong bond structure which has wetted, but not overwetted, both the substrate 4 and silicon die 1, and which has significantly filled the interstices between the fused particulate matter to add strength thereto and eliminate, in this respect, substantial moisture content.

With respect to this latter point, a residual gas analysis comparison of example M44 as set forth below, with a typical example produced according to the teachings of U.S. Pat. No. 4,459,166, resulted in a moisture content for the M44 of 456 ppm, and for the '166 material of 2777 ppm. The test was conducted as follows:

The M44 material and the '166 material were applied to the cavity floor of PGA (Pin Grid Array) packages in an amount sufficient to produce a fired thickness under the die of about 3 mils. A 300 mil square die was placed on top of each dot of material. The packages containing the M44 material were fired without drying at a peak temperature of about 340° C. for about 5 minutes. The '166 material was dried for about 1 hour at about 70° C., then fired at a peak temperature of about 420° C. for about 5 minutes. The latter packages ('166) were then processed in a forming gas (5% $H_2$, 95% $N_2$) cycle at a peak temperature of about 350° C. to reduce the nickel oxidation. Both sets of packages were then sealed in a $N_2$ atmosphere of about 350° C. with an AuSn preform and Au plated Kovar lid forming a hermetic seal.

An outside testing laboratory (Oneida Research Services, Inc.) then ran an RGA (residual gas analysis) by puncturing the lids while in a vacuum chamber and detecting gases within the previously sealed packages by standard mass spectrometry analysis.

This invention will now be described with respect to certain examples, some of which are plotted in the ternary diagrams of FIGS. 1-3. The specific procedure employed was as follows:

1. The glasses were prepared for testing by weighing out the various oxides as indicated, blending them together as a homogeneous powder mixture and placing them in a suitable crucible for melting. The crucible was then placed in a furnace and the contents melted at 550°-600° C. Time at temperature was typically 10 minutes. The melting crucible was rocked back and forth at a temperature of about 500° C. to assure that all ingredients went into solution.

2. The crucible was then removed while hot and the molten glass was poured onto a metal plate, e.g. aluminum. The resultant paddie was inspected for crystallinity and uniformity. Those that were homogeneous without a large degree of crystallinity were selected for further testing. Those that were not were eliminated as obviously unacceptable.

3. The selected glass that passed initial inspection were ground by standard particle reduction methods (e.g. ceramic jar mill or by hand with mortar and pestle) into a fine powder. The fine powder was then made into a paste by the addition of terpineol 318, typically 20% by weight. No Ag particle loading was done at this point.

4. The pastes were then dotted onto approximately 92% $Al_2O_3$ black body ceramic substrates which, in turn, were placed end-to-end on a graphite.slab. The slab was inserted into a tube furnace where a temperature gradient could be provided by adjusting the zone temperatures. This technique allowed the testing of various glasses simultaneously over a range of temperatures, typically 200°-350° C. A temperature probe was used to monitor the temperature at various positions in the tube. Once an equilibrium in temperature was obtained, the samples were pulled and inspected for the glassy edge, i.e. the temperature at which the glass begins to glaze. The degree of crystallinity was also noted and estimated, i.e. how much of the glass was a crystalline phase as opposed to a vitreous phase. Even though many of the glasses did not crystallize when poured from the melt, upon reheating as a powder above its softening point, it was found they would often rapidly recrystallize, rendering the glass impractical as an adhesive component.

The results are summarized in Table I, and are graphically illustrated in FIGS. 1-3. The shaded area in these ternary for the three ingredients $Tl_2O_3$, $V_2O_5$, and $P_2O_5$, which make up the essential ingredients of the glasses of this invention. The various examples given which fall within the shaded area help illustrate other ingredients which may be added without destroying the essential nature of this invention, and in this way, help define the term "consisting essentially of" as used to describe the invention herein.

To be understood, the following legend is provided for Table I and the symbols used when reporting the test results:

TABLE 1

| Melt # | M1 | M4 | M5 | M6 | M7 | M8 | M9 | M10 | M11 | M12 | M13 | M14 | M15 | M16 |
|---|---|---|---|---|---|---|---|---|---|---|---|---|---|---|
| Tl2O3 | 65.0 | 51.5 | 46.5 | 40.0 | 53.5 | 56.0 | 61.4 | 52.4 | 52.1 | 59.3 | 60.4 | 65.0 | 79.7 | 56.4 |
| V2O5 | 35.0 | 27.0 | 32.0 | 38.5 | 35.5 | 33.4 | 33.9 | 33.0 | 32.8 | 33.8 | 34.5 | 35.0 | 20.3 | 33.6 |
| P2O5 |  |  |  |  | 11.0 |  |  |  |  |  | 5.1 |  |  |  |
| Bi2O3 |  | 4.0 | 4.0 | 4.0 |  | 2.0 | 0.9 | 2.7 | 3.0 | 1.3 |  |  |  | 4.0 |
| ZnO |  | 3.0 | 3.0 | 3.0 |  | 1.5 | 0.7 | 2.0 | 2.3 | 1.0 |  |  |  | 3.0 |
| Nb2O5 |  | 3.0 | 3.0 | 3.0 |  | 1.5 | 0.7 | 2.0 | 2.3 | 0.9 |  |  |  | 3.0 |
| PbF2 |  | 10.0 | 10.0 | 10.0 |  | 4.9 | 2.2 | 6.8 | 7.6 | 3.2 |  |  |  |  |

TABLE 1-continued

| | | | | | | | | | | | | | | |
|---|---|---|---|---|---|---|---|---|---|---|---|---|---|---|
| Cu2O | | 1.0 | 1.0 | 1.0 | | 0.5 | 0.2 | 0.7 | 0.0 | 0.3 | | | | |
| Al2O3 | | 0.5 | 0.5 | 0.5 | | 0.2 | 0.1 | 0.3 | 0.0 | 0.2 | | | | |
| SiO2 | | | | | | | | | | | | | | |
| Ag2O | | | | | | | | | | | | | | |
| PbO | | | | | | | | | | | | | | |
| Pb2SiO4 | | | | | | | | | | | | | | |
| H3BO3 | | | | | | | | | | | | | | |
| Ta2O5 | | | | | | | | | | | | | | |
| WO3 | | | | | | | | | | | | | | |
| SnO2 | | | | | | | | | | | | | | |
| SeO2 | | | | | | | | | | | | | | |
| TeO2 | | | | | | | | | | | | | | |
| La2O3 | | | | | | | | | | | | | | |
| TOTAL % | 100.0 | 100.0 | 100.0 | 100.0 | 100.0 | 100.0 | 100.0 | 100.0 | 100.0 | 100.0 | 100.0 | 100.0 | 100.0 | 100.0 |
| Melt Stable | Y | N | Y | Y | Y | Y | Y | Y | Y | Y | Y | Y | Y | Y |
| Crystallize (during pour) | N | Y | P | N | P | N | S | N | N | Y | N | N | P | S |
| Glassy Edge (C) | 380.0 | | 405.0 | 350.0 | >400 | 370.0 | 404.0 | 323.0 | 323.0 | | 415.0 | 373.0 | — | |
| Crystallize (as paste) | Y | | P | N | Y | Y | Y | P | P | | Y | Y | P | Y |
| Firing Temp (C.) | 385.0 | | 405.0 | 400.0 | | 400.0 | 400.0 | 375.0 | 375.0 | · | 375.0 | | | |
| Cosmetics | B | | G | P | | G | F-G | G | G | | G | | | |
| Dot Adh. | | | | | | | | | | | | | | |
| Black | F | | G-E | | | | | | | | | | | |
| PGA | F | | | | F | | G | F-G | G | | P1 | VP1 | | |
| Die Adh. | | | | | | | | | | | | | | |
| Black | | | | | | | | | | | | | | |
| PGA | 0.0 | | | | | | | | | | | | | |

| Melt # | M17 | M18 | M19 | M20 | M21 | M22 | M23 | M24 | M25 | M26 | M27 | M28 | M29 | M30 |
|---|---|---|---|---|---|---|---|---|---|---|---|---|---|---|
| Tl2O3 | 57.0 | 56.0 | 56.0 | 64.0 | 64.0 | 64.0 | 63.5 | 60.5 | 59.5 | 62.0 | 61.3 | 61.5 | 60.9 | 77.0 |
| V2O5 | 33.9 | 33.5 | 33.4 | 35.0 | 35.5 | 35.0 | 35.0 | 34.5 | 34.5 | 35.0 | 35.0 | 35.1 | 34.8 | 21.0 |
| P2O5 | | | | | | | | | | | | | | 2.0 |
| Bi2O3 | 3.0 | 2.0 | 2.0 | | | | | | | | | | 0.5 | |
| ZnO | 2.3 | 1.5 | 1.5 | | | | | | | | | | 0.4 | |
| Nb2O5 | 2.3 | 1.5 | 1.5 | | | | | | | | | | 0.4 | |
| PbF2 | | 4.5 | 4.9 | | | 1.0 | 1.0 | 5.0 | 5.0 | 3.0 | | | | |
| Cu2O | 1.0 | 1.0 | 0.5 | | 0.5 | | 0.5 | | 1.0 | 3.0 | 3.0 | 3.0 | 3.0 | |
| Al2O3 | 0.5 | | 0.2 | | | | | | | | 0.7 | | | |
| SiO2 | | | | 1.0 | | | | | | | | 0.4 | | |
| Ag2O | | | | | | | | | | | | | | |
| PbO | | | | | | | | | | | | | | |
| Pb2SiO4 | | | | | | | | | | | | | | |
| H3BO3 | | | | | | | | | | | | | | |
| Ta2O5 | | | | | | | | | | | | | | |
| WO3 | | | | | | | | | | | | | | |
| SnO2 | | | | | | | | | | | | | | |
| SeO2 | | | | | | | | | | | | | | |
| TeO2 | | | | | | | | | | | | | | |
| La2O3 | | | | | | | | | | | | | | |
| TOTAL % | 100.0 | 100.0 | 100.0 | 100.0 | 100.0 | 100.0 | 100.0 | 100.0 | 100.0 | 100.0 | 100.0 | 100.0 | 100.0 | 100.0 |
| Melt Stable | Y | Y | Y | N | Y | Y | Y | Y | Y | Y | Y | Y | Y | Y |
| Crystallize (during pour) | S | N | S | Y | P | N | S | N | S | N | N | N | N | N |
| Glassy Edge (C) | | 370.0 | 390.0 | | 370.0 | 370.0 | 370.0 | | | | | | | 380.0 |
| Crystallize (as paste) | Y | Y | N | | P | P | P | Y | Y | Y | Y | Y | Y | P |
| Firing Temp (C.) | | | | | | | | | | | | | | 383.0 |
| Cosmetics | | | | | | | | | | | | | | G |
| Dot Adh. | | | | | | | | | | | | | | |
| Black | | | | | | | | | | | | | | F |
| PGA | | | | | | | | | | | | | | F-G |
| Die Adh. | | | | | | | | | | | | | | |
| Black | | | | | | | | | | | | | | |
| PGA | | | | | | | | | | | | | | E |

| Melt # | M31 | M32 | M33 | M34 | M35 | M36 | M37 | M38 | M39 | M40 | M41 | M42 | M43 | 44 |
|---|---|---|---|---|---|---|---|---|---|---|---|---|---|---|
| Tl2O3 | 77.0 | 75.5 | 78.5 | 76.0 | 79.7 | 75.0 | 75.5 | 74.7 | 72.7 | 74.0 | 77.0 | 71.0 | 70.0 | 72.0 |
| V2O5 | 21.0 | 20.5 | 20.5 | 20.0 | 20.3 | 20.0 | 20.0 | 20.0 | 20.0 | 19.3 | 19.0 | 16.0 | 22.0 | 18.0 | 19.0 |
| P2O5 | 2.0 | | 1.0 | 4.0 | | 4.0 | 4.0 | 4.0 | 4.0 | 7.0 | 7.0 | 7.0 | 7.0 | 9.0 |
| Bi2O3 | | | | | | | | | | | | | | |
| ZnO | | | | | | | | | 1.3 | | | | | |
| Nb2O5 | | 4.0 | | | | | | | | | | | | |
| PbF2 | | | | | | | | | | | | | | |
| Cu2O | | | | | | | 1.0 | | | | | | | |
| Al2O3 | | | | | | | | 0.5 | | | | | | |
| SiO2 | | | | | | | | | | | | | | |
| Ag2O | | | | | | | | | | | | | | |
| PbO | | | | | | | | | | | 4.0 | | | |
| Pb2SiO4 | | | | | | | | | | | | | | 5.0 |
| H3BO3 | | | | | | | | | | | | | | |

TABLE 1-continued

| | | | | | | | | | | | | | | |
|---|---|---|---|---|---|---|---|---|---|---|---|---|---|---|
| Ta2O5 | | | | | | | | | | | | | | |
| WO3 | | | | | | | | | | | | | | |
| SnO2 | | | | | | | | | | | | | | |
| SeO2 | | | | | | | | | | | | | | |
| TeO2 | | | | | | | | | | | | | | |
| La2O3 | | | | | | | | | | | | | | |
| TOTAL % | 100.0 | 100.0 | 100.0 | 100.0 | 100.0 | 100.0 | 100.0 | 100.0 | 100.0 | 100.0 | 100.0 | 100.0 | 100.0 | 100.0 |
| Melt Stable | Y | Y | Y | Y | Y | Y | Y | Y | Y | Y | Y | Y | Y | Y |
| Crystallize (during pour) | P | Y | Y | N | Y | P | P | Y | N | N | N | N | S | N |
| Glassy Edge (C) | 380.0 | | | 293.0 | | 315.0 | 280.0 | 330.0 | 330.0 | 190.0 | 165.0 | 280.0 | | 200.0 |
| Crystallize (as paste) | Y | | | Y | | P | S | S | P | Y | N | Y | Y | N |
| Firing Temp (C.) | | | | 350.0 | | 350.0 | 350.0 | 350.0 | 350.0 | 350.0 | 350.0 | 350.0 | 350.0 | 300.0 |
| Cosmetics | | | | E | | F | E | P | G | G | G | F | G | G |
| Dot Adh. | | | | | | | | | | | | | | |
| Black | | | | | | E | G | G-E | G | | | | | |
| PGA | | | | E | | G | G-E | G-E | G | G | G | E | G | E |
| Die Adh. | | | | | | | | | | | | | | |
| Black | | | | | | P1 | P1 | G | P1 | | G | | E | E |
| PGA | | | | E | | | | | | | G | | | E |

| Melt # | M45 | M46 | M47 | M48 | M49 | M50 | M51 | M52 | M53 | M54 | M55 | M56 | M57 | M58 |
|---|---|---|---|---|---|---|---|---|---|---|---|---|---|---|
| Tl2O3 | 71.7 | 69.0 | 72.0 | 70.4 | 73.8 | 77.8 | 67.1 | 68.2 | 63.7 | 59.6 | 72.6 | 76.4 | 80.1 | 82.8 |
| V2O5 | 18.8 | 22.0 | 9.0 | 17.7 | 14.7 | 11.3 | 16.8 | 17.0 | 15.9 | 15.3 | 18.4 | 15.2 | 11.9 | 9.4 |
| P2O5 | 9.0 | 9.0 | 19.0 | 11.9 | 11.5 | 10.9 | 12.1 | 14.8 | 12.3 | 12.7 | | 8.4 | 8.0 | 7.8 |
| Bi2O3 | | | | | | | | | | | 1.7 | | | |
| ZnO | | | | | | | | | | | 1.3 | | | |
| Nb2O5 | | | | | | | | | | | 1.3 | | | |
| PbF2 | | | | | | | | | | | 4.2 | | | |
| Cu2O | | | | | | | | | | | 0.4 | | | |
| Al2O3 | 0.5 | | | | | | | | | | 0.2 | | | |
| SiO2 | | | | | | | | | | | | | | |
| Ag2O | | | | | | | 4.0 | | 8.1 | 12.4 | | | | |
| PbO | | | | | | | | | | | | | | |
| Pb2SiO4 | | | | | | | | | | | | | | |
| H3BO3 | | | | | | | | | | | | | | |
| Ta2O5 | | | | | | | | | | | | | | |
| WO3 | | | | | | | | | | | | | | |
| SnO2 | | | | | | | | | | | | | | |
| SeO2 | | | | | | | | | | | | | | |
| TeO2 | | | | | | | | | | | | | | |
| La2O3 | | | | | | | | | | | | | | |
| TOTAL % | 100.0 | 100.0 | 100.0 | 100.0 | 100.0 | 100.0 | 100.0 | 100.0 | 100.0 | 100.0 | 100.0 | 100.0 | 100.0 | 100.0 |
| Melt Stable | Y | Y | N | Y | Y | Y | Y | Y | Y | Y | N | Y | Y | Y |
| Crystallize (during pour) | P | N | — | N | N | N | N | N | N | N | | N | N | P |
| Glassy Edge (C) | 195.0 | 215.0 | — | 235.0 | 225.0 | 188.0 | 240.0 | 285.0 | 200.0 | 220.0 | | 175.0 | 175.0 | — |
| Crystallize (as paste) | S | P | | N | N | N | N | N | N | S | | N | N | Y |
| Firing Temp (C.) | | 350.0 | | 375.0 | 350.0 | | | 375.0 | 355.0 | 355.0 | | | | |
| Cosmetics | | F | | F | G | | | P1 | F-G | F-G | | | | |
| Dot Adh. | | | | | | | | | | | | | | |
| Black | | E | | E | | | | E | G-E | G-E | | | | |
| PGA | | E | | E | | | | | G | P1 | F | | | |
| Die Adh. | | | | | | | | | | | | | | |
| Black | | | | | | | | | | | | | | |
| PGA | | G-E | | G | F | | | G | P1 | P1 | | | | |

| Melt # | M59 | M60 | M61 | M62 | M63 | M64 | M65 | M66 | M67 | M68 | M69 | M70 | M71 | M72 |
|---|---|---|---|---|---|---|---|---|---|---|---|---|---|---|
| Tl2O3 | 83.7 | 80.4 | 77.4 | 81.9 | 76.3 | 62.3 | 76.2 | 79.7 | 76.0 | 75.5 | 69.0 | 64.4 | 72.0 | 72.0 |
| V2O5 | 10.3 | 13.3 | 19.6 | 5.4 | 10.1 | 24.8 | 16.0 | 20.3 | 15.7 | 19.0 | 22.0 | 25.6 | 19.0 | 19.0 |
| P2O5 | 6.0 | 6.3 | | 12.7 | 13.6 | 12.9 | 7.2 | | 7.3 | 2.4 | 9.0 | 10.0 | 9.0 | 9.0 |
| Bi2O3 | | | | | | | | | | | | | | |
| ZnO | | | | | | | | | | | | | | |
| Nb2O5 | | | | | | | | | | | | | | |
| PbF2 | | | | | | | | | | | | | | |
| Cu2O | | | | | | | | | | | | | | |
| Al2O3 | | | | | | | | | | | | | | |
| SiO2 | | | | | | | 0.6 | | 1.0 | | | | | |
| Ag2O | | | | | | | | | | | | | | |
| PbO | | | | | | | | | | | | | | |
| Pb2SiO4 | | | | | | | | | | | | | | |
| H3BO3 | | | 3.0 | | | | | | | 3.1 | | | | |
| Ta2O5 | | | | | | | | | | | | | | |
| WO3 | | | | | | | | | | | | | | |
| SnO2 | | | | | | | | | | | | | | |
| SeO2 | | | | | | | | | | | | | | |
| TeO2 | | | | | | | | | | | | | | |
| La2O3 | | | | | | | | | | | | | | |
| TOTAL % | 100.0 | 100.0 | 100.0 | 100.0 | 100.0 | 100.0 | 100.0 | 100.0 | 100.0 | 100.0 | 100.0 | 100.0 | 100.0 | 100.0 |

TABLE 1-continued

| | | | | | | | | | | | | | | |
|---|---|---|---|---|---|---|---|---|---|---|---|---|---|---|
| Melt Stable | N | Y | Y | Y | Y | Y | Y | Y | Y | Y | Y | Y | Y | Y |
| Crystallize (during pour) | — | S | Y | N | N | N | S | Y | S | P | N | N | N | N |
| Glassy Edge (C) | | 300.0 | — | 195.0 | 220.0 | 290.0 | 165.0 | | 185.0 | 370.0 | 225.0 | 265.0 | 205.0 | 205.0 |
| Crystallize (as paste) | | Y | | P | N | N | P | | N | Y | N | N | N | S |
| Firing Temp (C.) | | | | | | | | | | | | | | |
| Cosmetics | | | | | | | | | | | | | | |
| Dot Adh. | | | | | | | | | | | | | | |
| Black | | | | | | | | | | | | | | |
| PGA | | | | | | | | | | | | | | |
| Die Adh. | | | | | | | | | | | | | | |
| Black | | | | | | | | | | | | | | |
| PGA | | | | | | | | | | | | | | |

| Melt # | M73 | M74 | M75 | M76 | M77 | M78 | M79 | M80 | M81 | M82 | M83 | M84 | M85 | M86 |
|---|---|---|---|---|---|---|---|---|---|---|---|---|---|---|
| Tl2O3 | 74.4 | 73.5 | 68.9 | 72.9 | 71.0 | 71.4 | 70.3 | 70.3 | 68.4 | 70.6 | 71.6 | 70.8 | 71.6 | 71.0 |
| V2O5 | 18.8 | 18.5 | 17.4 | 18.2 | 19.9 | 18.7 | 19.7 | 18.6 | 18.1 | 18.8 | 19.0 | 18.7 | 18.7 | 18.6 |
| P2O5 | 4.7 | 7.0 | 6.5 | 8.9 | 9.1 | 9.3 | 9.4 | 6.8 | 6.6 | 6.9 | 6.9 | 6.9 | 7.2 | 7.1 |
| Bi2O3 | | | 7.2 | | | | | | | | | | | |
| ZnO | | | | | | | | | | | | | | |
| Nb2O5 | | | | | | | | | 4.3 | | | | | |
| PbF2 | | | | | | | | | | | | | | |
| Cu2O | | | | | | | | | | | | | | |
| Al2O3 | | | | | | | | | | | | | | |
| SiO2 | | | | | | 0.6 | 0.6 | | | | | | 0.6 | 0.6 |
| Ag2O | | | | | | | | | | | | | | |
| PbO | | | | | | | | | | | | 3.6 | | |
| Pb2SiO4 | | | | | | | | | | | | | | |
| H3BO3 | 2.1 | 1.0 | | | | | | | | | | | | |
| Ta2O5 | | | | | | | | | | 6.9 | | | | |
| WO3 | | | | | | | | | | | 3.7 | | | |
| SnO2 | | | | | | | | | | | | 2.5 | | |
| SeO2 | | | | | | | | | | | | | 1.9 | |
| TeO2 | | | | | | | | | | | | | | 2.7 |
| La2O3 | | | | | | | | | | | | | | |
| TOTAL % | 100.0 | 100.0 | 100.0 | 100.0 | 100.0 | 100.0 | 100.0 | 100.0 | 100.0 | 100.0 | 100.0 | 100.0 | 100.0 | 100.0 |
| Melt Stable | Y | Y | N | Y | Y | Y | Y | Y | Y | Y | Y | Y | Y | Y |
| Crystallize (during pour) | S | S | Y | N | N | N | N | S | P | N | Y | P | S | VS |
| Glassy Edge (C) | 340.0 | 200.0 | 205.0 | 205.0 | 210.0 | 205.0 | 205.0 | 210.0 | 200.0 | 215.0 | 310.0 | 330.0 | 185.0 | 185.0 |
| Crystallize (as paste) | Y | Y | | S | S | N | N | Y | Y | S | Y | Y | P | N |
| Firing Temp (C.) | | | | | | | | | | | | | | |
| Cosmetics | | | | | | | | | | | | | | |
| Dot Adh. | | | | | | | | | | | | | | |
| Black | | | | | | | | | | | | | | |
| PGA | | | | | | | | | | | | | | |
| Die Adh. | | | | | | | | | | | | | | |
| Black | | | | | | | | | | | | | | |
| PGA | | | | | | | | | | | | | | |

| Melt # | M87 | M88 | M89 | M90 | M91 | M92 | M93 | M94 |
|---|---|---|---|---|---|---|---|---|
| Tl2O3 | 69.2 | 68.1 | 65.7 | 62.5 | 64.8 | 66.4 | 65.7 | 68.8 |
| V2O5 | 18.1 | 21.7 | 23.9 | 20.0 | 20.8 | 21.1 | 17.3 | 18.0 |
| P2O5 | 4.6 | 9.6 | 9.8 | 7.6 | 4.9 | 7.4 | 7.4 | 6.9 |
| Bi2O3 | | | | | | | | |
| ZnO | | | | | | | | |
| Nb2O5 | | | | 1.9 | 1.8 | 0.9 | 1.8 | |
| PbF2 | | | | | | | | |
| Cu2O | | | | | | | | |
| Al2O3 | | | | 0.4 | 0.3 | 0.2 | 0.4 | |
| SiO2 | 0.6 | 0.6 | 0.6 | 0.6 | 0.6 | 0.6 | 0.6 | 0.6 |
| Ag2O | | | | | | | | |
| PbO | | | | | | | | |
| Pb2SiO4 | | | | | | | | |
| H3BO3 | | | | | | | | |
| Ta2O5 | | | | | | | | |
| WO3 | 7.5 | | | 4.1 | 4.0 | 2.0 | 4.0 | |
| SnO2 | | | | | | | | |
| SeO2 | | | | | | | | |
| TeO2 | | | | 2.9 | 2.8 | 1.4 | 2.8 | |
| La2O3 | | | | | | | | 5.7 |
| TOTAL % | 100.0 | 100.0 | 100.0 | 100.0 | 100.0 | 100.0 | 100.0 | 100.0 |
| Melt Stable | Y | Y | Y | Y | Y | Y | Y | Y |
| Crystallize (during pour) | P | N | N | N | N | N | S | Y |
| Glassy Edge (C) | 225.0 | 235.0 | 255.0 | 250.0 | 225.0 | 230.0 | 240.0 | — |
| Crystallize (as paste) | Y | N | N | N | Y | N | S | |
| Firing Temp (C.) | | | | | | | | |

TABLE 1-continued

Cosmetics
Dot Adh.
Black
PGA
Die Adh.
Black
PGA

Legend for Table 1
Y = yes, the melt was stable, exhibiting substantially no, or very little crystallinity
N = no, the melt was unstable, exhibiting clearly unacceptable crystalline amounts
P = partial, exhibiting some crystallinity that was close to unacceptable
S = slight, exhibiting a slight amount of crystallinity that might be acceptable under many circumstances
E = excellent cosmetics
G = good cosmetics
$P_1$ = poor cosmetics
F = fair cosmetics
V = very, to modify what it precedes
B = bad, utterly unacceptable From this group of examples a particularly preferred glass composition was chosen; namely, M44. The glass composition was made from a mixture of:

| | |
|---|---|
| 14.4 gms. | $Tl_2O_3$ |
| 3.8 gms. | $V_2O_5$ |
| 1.8 gms. | $P_2O_5$ |
| 20.0 gms. | TOTAL |

The mixture was heated in an aluminum cup at 550° C. for 10 minutes in air. The cup was rocked during the heat-up to assure a homogeneous solution. The molten glass was poured onto an aluminum surface and, upon cooling, the paddie of glass so formed was found to be 100% vitreous and homogeneous. The thermal coefficient of expansion of the glass was about 20 ppm/° C. While this is somewhat high, the Ag flake more than, compensates for it in practical use as an Ag/glass die attach paste.

A small portion of the glass was ground to a fine powder by using a mortar and pestle which, in turn, was used to make a glass paste consisting of about 20% by weight terpineol and 80% glass powder. Then an Ag/glass paste was made by milling the following ingredients on a three roll mill:

| | |
|---|---|
| 20 gms. | Ag flake |
| 6 gms. | of glass paste intermediate described above |
| 2 gms. | terpineol 318 |
| 28 gms. | Ag/glass paste |

Some of the glass paste was dotted on black ceramics of 92% $Al_2O_3$ and placed in a gradient furnace to look at the temperature characteristics and stability of the resulting body. The glassy edge temperature (i.e. the temperature at which the glass "glazed", i.e. softened and sintered into a glassy structure) was observed to be about 210° C. No significant crystallization was noted after cooling down.

The Ag/glass paste was used to bond electronic packages of the pin grid array (PGA) type ... schematically illustrated in FIG. 4. These PGA packages are typically used for the larger, more dense semiconductor chips. The Au plated metallization in these packages is much more difficult to adhere to than bare ceramic, since a glass, by its nature, more easily wets a ceramic because of its oxide surface. A unique property of this invention is the ability of the glass to wet and adhere to an Au (gold) surface at temperatures under about 350° C.

After application of the paste to the PGA substrate, the silicon die (e.g. schematically illustrated in FIG. 4 as item 1) was placed on top of the paste and the package was placed in a furnace for firing. Because no organic resins were used, or needed, no pre-drying step as is often employed in the Ag/glass paste prior art technique was required. Indeed, while a predrying step may be employed if desired in the practice of this invention, low moisture contents, as defined above, are generally achievable without it.

It is to be noted, in this respect, that the paste described had excellent rheological properties, believed due to the use of terpineol 318 (i.e. a mixture of alpha, beta, and gamma terpene alcohol), and an Ag flake having an appropriate surfactant. A particularly preferred Ag flake, in this respect, and the one used herein, is produced by Metz Corp., is labelled No. 15-ED, and has on its flake a type 4 stearic acid lubricant as a surfactant. The flake has a tap density of 3.7-4.4 gms/cc, an ASTM B-330-82 Fisher Subseive Sizer of, 7-1.0 microns, and a surface area (B.E.T.) of .8-1.1 $M^2$/gm. The use of this flake was found important when using M44 glass and terpineol 318 to achieve optimal results. Without such a combination of terpineol and surfactant the paste can become unstable in viscosity, evidence solvent bleed out on the substrate, have a tendency to settle out and exhibit poor rheology for dispensing. Such problems, for example, were experienced when other types of solvent/surfactant combinations were employed.

While the choice for any particular system is well within the level of skill of the artisan, once given the above, certain guidelines are helpful and important to follow in choosing a solvent and surfactant when resins are to be omitted. Firstly, the solvent should be a terpineol alcohol, and preferably one of a mixture of alpha, beta, and gamma type commercially available. Hercules terpineol 318 is an excellent example and is preferred. Next, the appropriate surfactant may be easily selected by brief, routine experimentation. The stearic acids are a particularly preferred type among the known fatty acid surfactants, while citric acid, for example, has been found not to work well. The skilled artisan will be able to easily select such a surfactant by simple formulation (e.g. loading silver flake in solvent with chosen surfactant) and evaluation of such characteristics as rheology, solids loading, viscosity stability, solvent bleed-out and suspension power. A particularly preferred system is the above-disclosed Metz silver flake used with terpineol 318.

Pastes so matched, as per the above, have been tested on a high volume production die attach machine and have resulted in superb dispensing properties and unexpectedly good results.

Returning now to the M44 package as is being formed in this example, the firing temperature was varied from 300°-365° C. with a 5 minute hold time. While possible to use lower temperatures, this temperature range was used to insure good filling of the interstices between the Ag flake, and adequate fusion of the flakes themselves. In this respect, because the devitrification edge exceeds 460° C. at 2-10 minutes, and because these temperatures are still quite low compared to the prior art, the res achieved constituted a dramatic improvement over the heretofore employed Ag/glass die attach methodologies. Generally speaking, then, the fusion step of this invention may be carried out at temperatures of about 50°-200° C. above the glassy edge temperature of the glass, but, in any event, should not exceed about 390° C., and preferably more than about 375° C.

The resulting package exhibited excellent stud pull adhesion, cosmetics, x-ray (no voids) and RGA (residual gas analysis) was also excellent as monitored. Die sizes ranging from..250 mil square to..590 mil square achieved excellent results.

Once given the above disclosure many other features, modifications and improvements will become apparent to the skilled artisan. For example, it is commonly known that many chemical precursors to the oxides described herein can be used to formulate the glasses of this invention. Phosphorus pentoxide, as an example, can be introduced into the glass batch as ammonium phosphate. It is also common practice in glass technology to use various additives, generally less than 5%, to alter the flow characteristics, expansion, chemical durability and the like, of the resultant glass. Minor modifications or additions to the ternary system, as stated above, may thus be made provided the essential characteristics of this invention are not altered. Additives other than Ag powder or flake are known, and may be used under the same guidelines. Such modifications, additions, or improvements are thus considered a part of this invention, the scope of which is to be determined by the following claims:

I claim:

1. A method of attaching an electronic device to a substrate, comprising the steps of:
    applying an essentially resin-free Ag/glass paste to the substrate and the electronic device to act as a bonding agent therebetween, said paste further comprising a solvent including at least one alcohol selected from the group consisting of terpene alcohol, trideconal and eodeconal, and a glass composition;
    heating the substrate, and the electronic deivce and said paste to a temperature of 390° C. or less for a time sufficient to fuse said glass composition and hereby bond the electronic device to the substrate, such that the substrate and the electronic device then form a single integral package; and
    cooling said integral package to room temperature.

2. A method of attaching an electronic device to a substrate, comprising the steps of:
    applying an essentially resin-free Ag/glass paste to the substrate and the electronic device to act as a bonding agent therebetween, said paste further comprising a solvent and a glass composition, wherein said glass composition has a glassy edge temperature of about 300° C. or less and consists essentially of by weight percent on an oxide basis: about 60-82.5% $Tl_2O_3$; about 2.5-27.5% $V_2O_5$; and about 2.5-17.5% $P_2O_5$;
    heating the substrate, the electronic device and said paste to a temperature of 390° C. or less for a time sufficient to fuse said glass composition, and thereby bond the electronic deivce to the substrate, such that said substrate and the electronic device then form a single integral package; and
    cooling said integral package to room temperature.

3. A method of attaching an electronic device to a substrate, comprising the steps of:
    applying an essentially resin-free Ag/glass paste to the substrate to act as a bonding agent therebetween, said paste further comprising a solvent and a glass composition, wherein said glass composition has a glassy edge temperature of about 300° C. or less and consists essentially of by weight on an oxide basis: about 69-74% $Tl_2O_3$; abot 16-22% $V_2O_5$ and about 7-10% $P_2O_5$;
    heating the substrate, the electronic deice and said paste onto a temperature of 390° C. or less for a time sufficient to fuse said glass composition, and thereby bond the electronic device to the substrate, such that said substrate and the electronic device then form a single integral package; and
    cooling said integral package to room temperature.

4. A method of attaching an electronic device to a substrate, comprising the steps of:
    applying an essentially resin-feed Ag/glass paste to the substrate to act as a bonding agent therebetween, said paste further comprising a solvent and a glass composition, wherein said glass composition has a glassy edge temperature of about 300° C. or less and consists essentially of by weight on an oxide basis: about 72% $Tl_2O_3$; f about 19% $V_2O_5$; and about 9.0% $P_2O_5$.
    heating the substrate, the electronic device and said base to a temperature of 390° C. or less for a item sufficient to fuse said glass composition, and thereby bond the electronic device to the substrate, such that said substrate and the electronic device then form a single integral package; and
    cooling said integral package to room temperature.

5. The method of claim 3, wherein said glassy edge temperature is about 250° C. or less.

6. The method of claim 3, wherein said glassy edge temperature is about 200° C. or less.

7. The method of claims 5, 6, 2, 3, or 4, wherein said heating is to a temperature of about 350° C. or less, and said paste further includes particles of silver.

8. The method of claims 5, 6, 2, 3 or 4, wherein said heating is to a temperature of about 300° C. or less.

9. The method of claims 5, 6, 2, 3 or 4, wherein said heating is to a temperature of about 250° C. or elss, and said paste consists essentially of about 70-72% silver flake,; about 16-20% glass; and about 10-12% terpineol.

10. The method of claims 5, 6, 2, 3 or 4, wherein said base further includes silver flake, said glass remains substantially non-crystalline throughout said heating and cooling to room temperature, and the resulting bond is substantially free of any organic material and has a moisture content of less than about 5000 ppm when hermetically sealed.

11. The method of claim 10, wherein the electronic device is an integrated circuit silicon die, said substrate is a ceramic package therefore, and said paste, which is essentially resin-free, and upon aid heating and cooling forms a bond between said package and die and the sealed package, has a moisture content of less than about 100 ppm, the glass portion of said bond being substantially non-crystalline.

12. The method of claim 11, wherein the bond has created a moisture content of less than about 500 ppm in a hermetically sealed package.

13. The method of claim 7, wherein said base further includes silver flake, said glass remains substantially non-crystalline throughout said heating and cooling to room temperature nd the resulting bond is substantially free of any organic material and has a moisture content of less than about 5000 ppm when hermetically sealed.

14. The method of claim 13, wherein the electronic device is an integrated circuit silicon die, said substrate is a ceramic package therefore, and said paste, which is essentially resin-free, and upon aid heating and cooling forms a bond between said package and die and he sealed package, has a moisture content of less than about 1000 ppm, the glass potion of said bond being substantially non-crystalline.

15. The method of claim 14, wherein the bond has created a moisture content of less than about 500 ppm in a hermetically sealed package.

* * * * *